(12) United States Patent
Wang et al.

(10) Patent No.: US 11,765,920 B2
(45) Date of Patent: Sep. 19, 2023

(54) ORGANIC ELECTROLUMINESCENT DISPLAY PANEL, MANUFACTURING METHOD THEREOF, AND DISPLAY DEVICE

(71) Applicant: BOE TECHNOLOGY GROUP CO., LTD., Beijing (CN)

(72) Inventors: Huifeng Wang, Beijing (CN); Wang Zhang, Beijing (CN); Jingang Fang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 107 days.

(21) Appl. No.: 17/395,179

(22) Filed: Aug. 5, 2021

(65) Prior Publication Data

US 2021/0367179 A1    Nov. 25, 2021

Related U.S. Application Data

(62) Division of application No. 16/076,420, filed as application No. PCT/CN2018/075022 on Feb. 2, 2018, now Pat. No. 11,114,636.

(30) Foreign Application Priority Data

Jul. 12, 2017    (CN) .......................... 201710567312.4

(51) Int. Cl.
*H01L 51/50*    (2006.01)
*H10K 50/13*    (2023.01)
(Continued)

(52) U.S. Cl.
CPC ......... *H10K 50/131* (2023.02); *H10K 50/822* (2023.02); *H10K 59/122* (2023.02);
(Continued)

(58) Field of Classification Search
CPC ............. H01L 51/5044; H01L 27/3246; H01L 51/0011
See application file for complete search history.

(56) References Cited

U.S. PATENT DOCUMENTS

2014/0103385 A1    4/2014    Hatano et al.
2016/0149155 A1    5/2016    Kim
(Continued)

FOREIGN PATENT DOCUMENTS

CN    103779470 A    5/2014
CN    104538423 A    4/2015
(Continued)

OTHER PUBLICATIONS

International Search Report and Written Opinion for PCT Application No. PCT/CN2018/075022, dated Apr. 28, 2018.
(Continued)

*Primary Examiner* — Anthony Ho
(74) *Attorney, Agent, or Firm* — DINSMORE & SHOHL LLP

(57) ABSTRACT

The present disclosure relates to an organic electroluminescent display panel, a method of manufacturing the same, and a display device that can alleviate or avoid the occurrence of pixel crosstalk problems due to lateral conduction of the charge generation layer. An organic electroluminescent display panel is provided which comprises: a substrate; an anode layer and a pixel defining layer over the substrate, the pixel defining layer defining pixel units, wherein a recess is provided in the pixel defining layer between adjacent pixel units; a stack of organic electroluminescent units over the anode layer and the pixel defining layer, the stack comprising at least two organic electroluminescent units and a charge generation layer disposed between organic electroluminescent units which are adjacent to each other; a cathode layer over the stack, wherein the corresponding charge
(Continued)

generation layers of the adjacent pixel units are disconnected at the recesses, and wherein the cathode layer is continuous at the recess.

11 Claims, 5 Drawing Sheets

(51) Int. Cl.
*H10K 50/822* (2023.01)
*H10K 59/122* (2023.01)
*H10K 71/00* (2023.01)
*H10K 71/60* (2023.01)
*H10K 71/16* (2023.01)
*H10K 71/20* (2023.01)
*H10K 59/12* (2023.01)

(52) U.S. Cl.
CPC ........... *H10K 71/00* (2023.02); *H10K 71/164* (2023.02); *H10K 71/166* (2023.02); *H10K 71/233* (2023.02); *H10K 71/60* (2023.02); *H10K 59/1201* (2023.02)

(56) References Cited

U.S. PATENT DOCUMENTS

| | | |
|---|---|---|
| 2016/0190521 A1 | 6/2016 | Lee et al. |
| 2016/0268354 A1 | 9/2016 | Xiong et al. |
| 2018/0019434 A1 | 1/2018 | Park et al. |
| 2018/0301521 A1 | 10/2018 | Yang |

FOREIGN PATENT DOCUMENTS

| | | |
|---|---|---|
| CN | 104659070 A | 5/2015 |
| CN | 105590954 A | 5/2016 |
| CN | 105742323 A | 7/2016 |
| CN | 106206645 A | 12/2016 |
| CN | 106449701 A | 2/2017 |
| CN | 106876331 A | 6/2017 |
| CN | 107359263 A | 11/2017 |
| CN | 107634147 A | 1/2018 |
| KR | 20100066221 A | 6/2010 |

OTHER PUBLICATIONS

First Office Action for CN Appln. No. 201710567312.4 dated Jun. 28, 2018.
Second Office Action for CN Appln. No. 201710567312.4 dated Dec. 12, 2018.

ORGANIC ELECTROLUMINESCENT DISPLAY PANEL, MANUFACTURING METHOD THEREOF, AND DISPLAY DEVICE

CROSS-REFERENCE TO RELATED APPLICATIONS

The present application is a divisional of U.S. patent application Ser. No. 16/076,420 filed on Aug. 8, 2018, which is a 35 U.S.C. § 271 national phase entry of PCT/CN2018/075022 filed Feb. 2, 20218, which in turn claims priority to Chinese Patent Application No. 201710567312.4 filed on Jul. 12, 2017, the whole contents of which are hereby incorporated by reference.

FIELD

The present disclosure relates to the field of display technologies, and in particular, to an organic electroluminescent display panel, a method of manufacturing the same, and a display device.

BACKGROUND

Organic Electroluminescent Display panel (represented by Organic Light Emitting Diode (OLED)), compared with liquid crystal display (LCD), has self-luminescence, high luminescence efficiency, low power consumption, fast response, and wide viewing angle, high brightness, bright colors, thin profile and light weight, and thus is considered as the next generation of display technology.

In order to improve the performance of the OLED display panel, a tandem OLED display panel was proposed. At present, the organic functional layers of the tandem OLED display panel can be formed with a Fine Metal Mask (FMM) or an Open Mask. The open mask is low in cost and simple in process with respect to the fine metal mask. As shown in FIG. 1, a tandem OLED display panel generally includes: a substrate 01, an anode layer 02 and a pixel defining layer 03 defining pixel units disposed on the substrate 01, a cathode layer 04 and a stack of organic electroluminescent units provided between the anode layer 02 and the cathode layer 04 and covering the anode layer 02 and the pixel defining layer 03. The stack may include at least two organic electroluminescent units 05 arranged in series and a charge generation layer 06 disposed between adjacent organic electroluminescent units 05. In the tandem OLED display panel as described above, the charge generation layer covers the entire display region, that is, the same charge generation layer is continuous between each pixel unit and a adjacent pixel unit. And the charge generation layer has a large lateral conductivity. Therefore, it is prone to cause pixel crosstalk problems.

Thus, it is desirable for those skilled in the art to address the pixel crosstalk problem caused by the lateral conduction of the charge generation layer.

SUMMARY

Embodiments of the present disclosure provide organic electroluminescent display panels, manufacturing methods thereof, and display devices to address the pixel crosstalk problem(s) caused by lateral conduction of the charge generation layer.

An organic electroluminescent display panel according to an embodiment of the present disclosure includes: a substrate, an anode layer and a pixel defining layer defining pixel units disposed on the substrate, and a cathode layer covering the anode layer and the pixel defining layer, at least two serially connected organic electroluminescent units disposed between the anode layer and the cathode layer and covering the anode layer and the pixel defining layer, and a charge generation layer provided between each two adjacent organic electroluminescent unit; wherein a recess is provided in the pixel defining layer between adjacent pixel units, and each of the charge generation layer(s) is disconnected at the recess, and the cathode layer is continuous in the recess.

The organic electroluminescent display panel according to an embodiment of the present disclosure includes: a substrate, an anode layer and a pixel defining layer defining pixel units disposed on the substrate, and a cathode layer covering the anode layer and the pixel defining layer, at least two serially connected organic electroluminescent units disposed between the anode layer and the cathode layer and covering the anode layer and the pixel defining layer, and a charge generation layer provided between each two adjacent organic electroluminescent unit; wherein a recess is provided in the pixel defining layer between adjacent pixel units, and each of the charge generation layer(s) is disconnected at the recess, and the cathode layer is continuous in the recess. Since the cathode layer is continuous at the recess, it is ensured that the pixels can be normally lit; and each of charge generation layers is broken at the recess, thereby preventing lateral conduction of charges to adjacent pixel units, thereby the pixel crosstalk problem caused by the lateral conduction of the charge generation layer can be avoided.

In some embodiments, the recess between adjacent pixel units is shared.

Since the recess between adjacent pixel units is shared, the spacing between adjacent pixel units can be reduced, so that the aperture ratio of the organic electroluminescent display panel can be increased.

In some embodiments, the recess extends through the pixel defining layer in a thickness direction thereof. In some embodiments, the recess includes two opposite sidewalls, wherein at least one of the sidewalls has a protrusion that protrudes toward the other sidewall. In some embodiments, a distance from the projection of a remote end of the protrusion on the substrate to the projection, on the substrate, of an intersection line of the bottom of the recess with the sidewall from which the protrusion extends is 0.1-5 μm.

In some embodiments, the number of the organic electroluminescent units is N, wherein N is an integer ≥2, and a height of the remote end of the protrusion of the recess to the bottom of the recess is greater than a sum of the thickness of the (N−1) organic electroluminescent units which are adjacent to the anode layer side and the thickness of all of the charge generation layers, and less than a sum of the thickness of the N organic electroluminescent units, the thickness of all of the charge generation layers and the thickness of the cathode layer.

In some embodiments, each of the organic electroluminescent units includes in order, from the anode layer side to the cathode layer side, a hole injection layer, a hole transport layer, a light emitting layer, an electron transport layer, and an electron injection layer.

According to a further embodiment of the present disclosure, a display device is provided that comprises the organic electroluminescent display panel according to any embodiment of the present disclosure.

According to the display device provided by the embodiments of the present disclosure, it is possible to ensure that the pixels can be normally lit, and the lateral conduction of the charge to an adjacent pixel unit can be avoided, thereby avoiding the pixel crosstalk problem caused by the lateral conduction of the charge generation layer.

According embodiments of the present disclosure, a method for manufacturing an organic electroluminescent display panel is provided that comprises: forming an anode layer over a substrate; forming a pixel defining layer defining pixel units over the substrate on which the anode layer is formed; wherein a recess is provided in the pixel defining layer between adjacent pixel units; at least two series-connected electroluminescent units over the substrate on which the pixel defining layer is formed to cover to the anode layer and the pixel defining layer, and a charge generation layer is formed between adjacent organic electroluminescent units; wherein each of the charge generation layer(s) is broken at the recess; over the farthest organic electroluminescent unit from the substrate, a cathode layer is formed to cover the anode layer and the pixel defining layer; wherein the cathode layer is continuous at the recess.

According to the manufacturing methods of the embodiments of the present disclosure, an improved organic electroluminescent display panel can be provided which can prevent lateral conduction of charges to adjacent pixel units, thereby avoiding occurrence of pixel crosstalk problems due to lateral conduction of the charge generation layer.

In some embodiments, there are N organic electroluminescent unit provided, wherein N is an integer ≥2. Forming the pixel defining layer defining the pixel units over the substrate on which the anode layer is formed includes:

forming a position-occupying layer between adjacent pixel units over the substrate on which the anode layer is formed; wherein the height of the position-occupying layer is greater than a sum of a thickness of the (N−1) organic electroluminescent units near the anode layer side and a thickness of all of the charge generation layers, and less than a sum of a thickness of the N organic electroluminescent units, a thickness of all of the charge generation layers, and a thickness of the cathode layer; forming a pixel defining layer defining pixel units over the substrate on which the position-occupying layer is formed; the pixel defining layer including an opening on the position-occupying layer and partially exposing the position-occupying layer; removing the position-occupying layer to form a recess in the pixel defining layer between adjacent pixel units; the recess including two opposite sidewalls, wherein at least one of the sidewalls has a protrusion protruding towards the other sidewall.

In some embodiments, forming the position-occupying layer comprises: forming a position-occupying layer using $SiO_2$ material. The removing the position-occupying layer specifically includes: performing a dry etching on the position-occupying layer with $CF_4$ to remove the position-occupying layer.

In some embodiments, forming the position-occupying layer comprises: forming the position-occupying layer with a metal material. Before removing the position-occupying layer, the method further comprises: crystallizing the anode layer. The removing the position-occupying layer comprises: performing a wet etching on the position-occupying layer with a metal etching solution to remove the position-occupying layer.

In some embodiments, forming the position-occupying layer comprises: forming the position-occupying layer with a positive photoresist material. Forming the pixel defining layer includes: forming the pixel defining layer with a negative photoresist material. The removing the position-occupying layer comprises: exposing the positive-photoresist position-occupying layer while exposing the negative-photoresist pixel defining layer; and peeling the exposed position-occupying layer with a positive photoresist stripping solution.

In some embodiments, the forming the organic electroluminescent unit comprises: sequentially preparing a hole injection layer, a hole transport layer, a light emitting layer, an electron transport layer, and an electron injection layer in a direction from the anode layer side to the cathode layer side.

In some embodiments, the forming the organic electroluminescent unit comprises: forming the organic electroluminescent unit by an open mask evaporation.

In some embodiments, the forming the charge generation layer comprises: forming the charge generation layer by an open mask evaporation.

In some embodiments, the forming the cathode layer comprises: forming the cathode layer by an open mask evaporation.

According to another aspect of the present disclosure, an organic electroluminescent display panel is provided which comprises: a substrate; an anode layer and a pixel defining layer over the substrate, the pixel defining layer defining pixel units, wherein a recess is provided in the pixel defining layer between adjacent pixel units; a stack of organic electroluminescent units over the anode layer and the pixel defining layer, the stack comprising at least two organic electroluminescent units and a charge generation layer disposed between organic electroluminescent units which are adjacent to each other; and a cathode layer over the stack, wherein the corresponding charge generation layers of the adjacent pixel units are disconnected at the recesses, and wherein the cathode layer is continuous at the recess.

In some embodiments, the recess between adjacent pixel units are shared by the adjacent pixel units. In some embodiments, the recess penetrates the pixel defining layer in a thickness direction of the pixel defining layer.

In some embodiments, the recess comprises two opposite sidewalls, and wherein at least one of the sidewalls has a first portion and a second portion protruding from the first portion towards the other sidewall. In some embodiments, a distance between a projection of an end of the second portion, which is adjacent to the other sidewall, on the substrate and a projection, on the substrate, of an intersection line of a bottom of the corresponding recess with the first portion is 0.1-5 μm.

In some embodiments, in each of the pixel units, the stack comprises N organic electroluminescent units, and N is an integer ≥2. In some embodiments, in the pixel defining layer associated with the pixel unit, a height of a lower edge of the end of the second portion of the recess to a bottom of the recess is greater than a sum of the thickness of (N−1) organic electroluminescent units on a side of the pixel defining layer, which is adjacent to the anode layer, and the thicknesses of all of the charge generation layers, and less than a sum of the thickness of the N organic electroluminescent units, the thickness of all of the charge generation layers, and the thickness of the cathode layer.

In some embodiments, each of the organic electroluminescent units comprises, from the anode layer side to the cathode layer side, in order: a hole injection layer, a hole transport layer, a light-emitting layer, an electron transport layer, and an electron injection layer.

According to a further aspect of the present disclosure, a display device is provided that comprises the organic electroluminescent display panel according to any one of the embodiments.

According to a still further aspect of the present disclosure, a method of manufacturing an organic electroluminescent display panel is provided which comprises: forming over a substrate an anode layer for pixel units and a pixel defining layer for defining the pixel units, wherein a recess is provided in the pixel defining layer between adjacent pixel units; forming a stack of organic electroluminescent units over the anode layer and the pixel defining layer, the stack comprising at least two organic electroluminescent units and a charge generation layer between adjacent organic electroluminescent units, wherein the corresponding discharge generation layers of adjacent pixel units are disconnected at the recess; and forming a cathode layer over the substrate over which the stack is formed, wherein the cathode layer is continuous at the recess.

In some embodiments, in each of the pixel units, the stack comprises N organic electroluminescent units, and N is an integer ≥2. In some embodiments, forming over the substrate the anode layer for the pixel units and the pixel defining layer for defining the pixel units comprises: forming the anode layer for the pixel units over the substrate; forming a position-occupying layer at a position on the substrate corresponding to the recess to be formed, wherein a height of the position-occupying layer is set to be larger than a sum of the thicknesses of (N−1) organic electroluminescent units and all of the charge generation layers to be formed over the anode layer, and less than a sum of the thickness of the N organic electroluminescent units to be formed, the thickness of all of the charge generation layers, and the thickness of the cathode layer; forming a pixel defining layer for defining pixel units, the pixel defining layer including an opening on the position-occupying layer, the opening exposing a part of the position-occupying layer; and removing the position-occupying layer to form the recess in the pixel defining layer, wherein the recess comprises two opposite sidewalls, wherein at least one of the sidewalls has a first portion and a second portion protruding from the first portion towards the other sidewall.

In some embodiments, a distance between a projection, on the substrate, of an end of the second portion which is adjacent to the other sidewall and a projection, on the substrate, of an intersection line of the first portion with the bottom of the corresponding recess is 0.1-5 μm. In some embodiments, the recess penetrates the pixel defining layer in a thickness direction of the pixel defining layer.

In some embodiments, forming the position-occupying layer comprises forming the position-occupying layer with $SiO_2$ material. In some embodiments, removing the position-occupying layer comprises dry etching the position-occupying layer with $CF_4$ to remove the position-occupying layer.

In some embodiments, forming the position-occupying layer comprises forming the position-occupying layer with a metal material. In some embodiments, removing the position-occupying layer comprises: wet etching the position-occupying layer with a metal etching solution to remove the position-occupying layer. The method may further comprises: before removing the position-occupying layer, crystallizing the anode layer.

In some embodiments, forming the position-occupying layer comprises forming the position-occupying layer with a positive photoresist material. In some embodiments, forming the pixel defining layer comprises forming the pixel defining layer with a negative photoresist material. In some embodiments, removing the position-occupying layer comprises: exposing the position-occupying layer formed with the positive photoresist material while exposing the pixel defining layer formed with the negative photoresist material; and stripping the exposed position-occupying layer off using a positive photoresist stripping solution.

In some embodiments, the organic electroluminescence unit comprises: a hole injection layer, a hole transport layer, a light-emitting layer, an electron transport layer, and an electron injection layer which are sequentially formed in a direction from the anode layer side to the cathode layer side.

In some embodiments, the organic electroluminescence unit is formed by evaporation using an open mask. In some embodiments, the charge generation layer is formed by evaporation using an open mask. In some embodiments, the cathode layer is formed by evaporation using an open mask.

Further features and advantages of the present disclosure will become apparent from the detailed descriptions of the embodiments of the present disclosure with reference to the drawings as below.

DETAILED DESCRIPTION OF EMBODIMENTS

Figure 1:
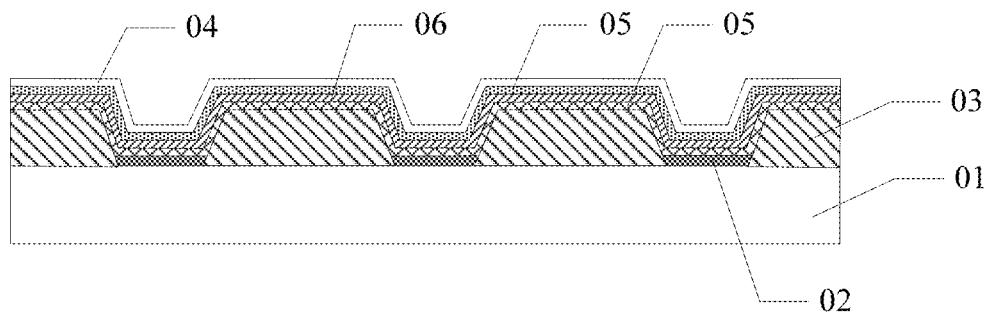
FIG. 1 is a schematic structural view of a tandem OLED display panel in the prior art.

According to embodiments of the present disclosure, organic electroluminescent display panels, methods of manufacturing the same, and display devices are provided that can alleviate or avoid pixel crosstalk problems caused by lateral conduction of the charge generation layer.

The technical solutions in the embodiments of the present disclosure will be clearly and completely described in the following with reference to the accompanying drawings. It is obvious that the described embodiments are only a part of the embodiments of the present disclosure, and not all of the embodiments. All other embodiments that would be obviously obtained by a person of ordinary skills in the art based on the embodiments of the present disclosure without inventive work are intended to be embraced in the scope of the present disclosure.

It should be noted that the thicknesses and shapes of the layers in the drawings of the present disclosure are not intended to reflect the true proportions, and are merely for illustrating contents of the present disclosure.

Figure 2:
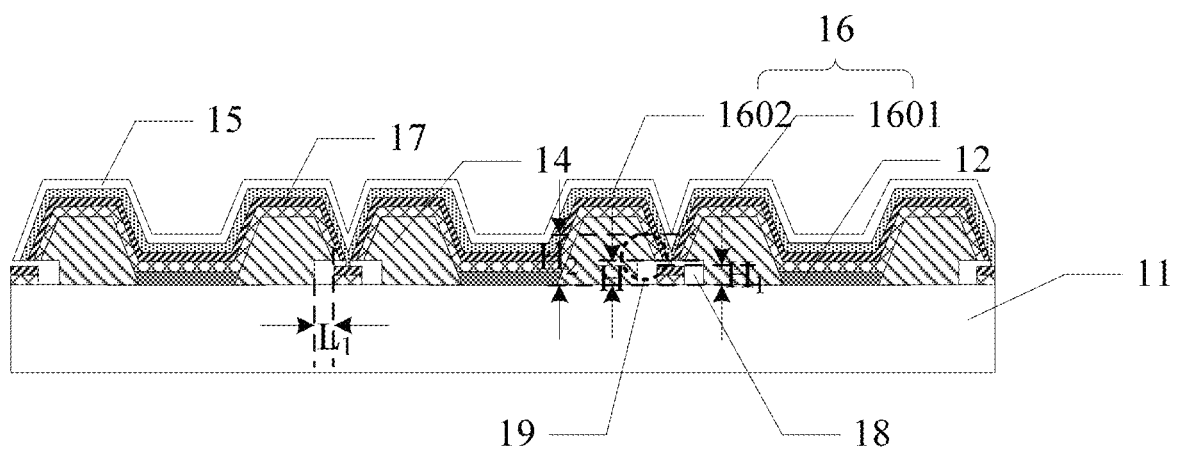
FIG. 2 is a schematic structural view of an organic electroluminescent display panel according to an embodiment of the present disclosure.
Figure 3:
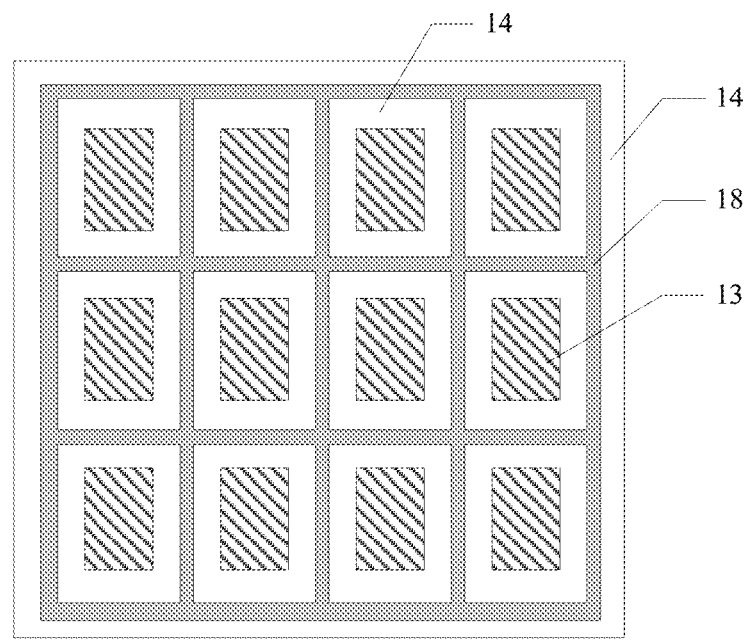
FIG. 3 is a top plan view of a pixel defining layer in an organic electroluminescent display panel according to an embodiment of the present disclosure.

FIG. 2 shows a schematic structural view of an organic electroluminescent display panel according to an embodiment of the present disclosure. FIG. 3 illustrates a top view of a pixel defining layer in an organic electroluminescent display panel in accordance with an embodiment of the present disclosure. Referring to FIGS. 2 and 3, an organic electroluminescent display panel according to some embodiments of the present disclosure may include: a substrate 11, an anode layer 12 and a pixel defining layer 14 defining pixel units 13 disposed on the substrate 11, and a cathode layer 15. A stack of organic electroluminescent units is provided between the anode layer 12 and the cathode layer 15, the stack of organic electroluminescent units covering the anode layer 12 and the pixel defining layer 14. The stack comprises at least two organic electroluminescent units 16 arranged in series. The figure shows an example including two organic electroluminescent units, wherein the two organic electroluminescent units 16 connected in series are respectively a first organic electroluminescent unit 1601 at a side close to the substrate 11 and a second organic electroluminescent unit 1602 at a side away from the substrate 11. The stack further includes a charge generation layer 17 disposed between adjacent organic electroluminescent units 16. A recess 18 is provided in the pixel defining layer 14 between adjacent pixel units 13.

In addition, as shown in FIG. 2, the charge generation layer (CGL) 17 is disconnected at the recess 18, and the cathode layer 15 is continuous at the recess 18. It should be noted herein that the stack in each pixel unit in the embodiment shown in FIG. 2 includes only two organic electroluminescent units. For the case where the stack includes more than two organic electroluminescent units, the corresponding charge generation layers of the respective adjacent pixel units are disconnected at the recess. For example, in the case where the stack in a pixel unit includes three organic electroluminescent units and two CGLs disposed between adjacent organic electroluminescent units, the two charge generation layers between adjacent pixel units are all broken at the recess. Additionally, in the embodiments of the present disclosure, the cathode layer is configured to be continuous at the recess. In this way, adjacent pixel units can share a common cathode layer, thereby the structure can be simplified, manufacturing steps can be reduced, and manufacturing cost can be reduced.

In some embodiments, the recess 18 may surround the pixel unit 13 in one turn, as shown in FIG. 3. The recess 18 can also surround the pixel unit 13 in a plurality of turns. In addition, in some embodiments, for the pixel unit 13 at the edge of the organic electroluminescent display panel, the recess 18 may be not provided at the side of the pixel unit 13 near the edge. The present disclosure is not limited to the embodiments mentioned herein.

In the above organic electroluminescent display panels, since the cathode layer 15 is continuous at the recess 18, and each of the charge generation layer 17 is disconnected at the recess 18, it is ensured that the pixel can be normally lit and the lateral charge conduction to the adjacent pixel unit 13 can be avoided, thus the occurrence of pixel crosstalk problems due to the lateral conduction of the charge generation layer 17 can be avoided.

In some embodiments, in order to increase the aperture ratio of the organic electroluminescent display panel, as shown in FIG. 2, the recesses 18 between adjacent pixel units 13 are shared by the adjacent pixel units. Of course, the recesses 18 between adjacent pixel units 13 may also be partially shared, and a part thereof is not shared. For example, a recess 18 may be disposed around a pixel unit 13 and surround the pixel unit 13 one turn, and an additional recess 18 may be disposed outside the one-turn recess 18 surrounding the unit and be shared with an adjacent pixel unit 13.

Figure 4:
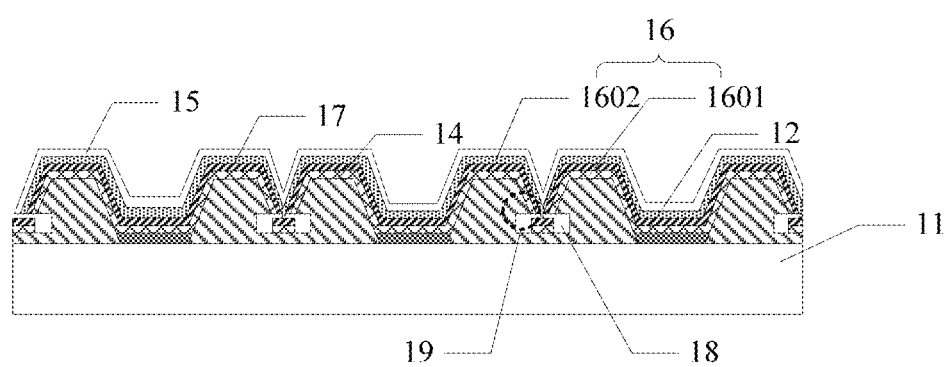
FIG. 4 is a schematic structural view of another organic electroluminescent display panel according to an embodiment of the present disclosure.

In some embodiments, as shown in FIG. 2, the recess 18 can be disposed in the middle portion of the pixel defining layer 14 between adjacent pixel units 13. In some embodiments, the recess 18 can be configured to penetrate through the pixel defining layer 14, for example, as shown in FIG. 2, the recess 18 can penetrate through the pixel defining layer 14 in the thickness direction of the pixel defining layer 14. Of course, in other embodiments, the recesses 18 may not extend through the pixel defining layer 14 as long as each of the charge generation layers 17 can be broken at the recess 18. It should be understood that the size of the recess may be set according to the parameters (e.g., size (thickness, etc.) material, etc.) of the organic light emitting unit (or a stack thereof) in the pixel unit to be formed; for example, in some embodiments, the size of the recess can be variously configured as long as it is guaranteed that each of the charge generation layers 17 can be broken at the recess 18 and the cathode layer 15 can be continuous at the recess 18, as shown in FIG. 4. It should be understood herein that by keeping the cathode layer continuous, it is possible to avoid otherwise providing separate wiring for the separated cathode layers of the individual pixel units, thereby simplifying the structure and process.

In some embodiments, the recess 18 includes two opposite sidewalls, at least one of which has a protrusion 19 that projects towards the other sidewall. In some embodiments, both sidewalls have protrusions 19 that protrudes toward opposite sidewalls as shown in FIG. 2 in dashed box. In other words, the sidewall of the recess may have a first portion and a second portion (i.e., the protrusion 19) that protrudes from the first portion toward the opposite other sidewall. The first part can intersect the bottom of the recess.

In some embodiments, The distance L1 between the projection of the top of the protrusion 19 (i.e., an end of the protrusion adjacent the opposite sidewall) and the projection, on the substrate 11, of the intersection line of the bottom of the recess 18 with the sidewall where the protrusion 19 is located (i.e., the intersection line of the bottom of the recess with the first portion) may be 0.1-5 μm as shown in FIG. 2. In some embodiments, in each pixel unit, the stack may include N organic electroluminescent units 16, wherein N is an integer greater than or equal to 2 (≥2). In some embodiments, the height of a lower edge of an end of the protrusion 19 on a sidewall of the recess 18, which is adjacent to the opposite sidewall, to the bottom of the recess 18 is set to be larger than a sum of the thickness of the (N−1) organic electroluminescent units of the stack which are formed over a side of the pixel defining layer which is adjacent to the anode layer (or, on the anode layer) and the thickness of all of the charge generation layers, and less than a sum of the thickness of the N organic electroluminescent units, the thickness of all of the charge generation layers and the thickness of the cathode layer.

For example, if the stack in the pixel unit includes two organic electroluminescent units 16 and one charge generation layer, the height H of the end of the protrusion 19 of the sidewall of the corresponding recess 18 (i.e., the end close to the opposite sidewall) to the bottom of the recess 18 is set to be larger than the sum H1 of the thickness of one organic electroluminescent unit 16 near the anode layer 12 and the thickness of the one charge generation layer 17, and less than the sum H2 of the thickness of the two organic electroluminescent units 16, the thickness of the one charge generation layer 17, and the thickness of the cathode layer 15, as shown in FIG. 2. Similarly, if the stack includes three organic electroluminescent units 16 and two charge generation layers 17, the height of the end of the protrusions 19 of the sidewall of the recess 18 (i.e., the end near the opposite sidewalls) to the bottom of the recess 18 is set to be larger than the sum of the thickness of the two organic electroluminescent units 16 adjacent to the anode layer 12 and the thicknesses of the two charge generation layers 17, and less than the sum of the thickness of the three organic electroluminescent units 16, the thickness of the two charge generation layers 17, and the thickness of the cathode layer 15.

Figure 5:
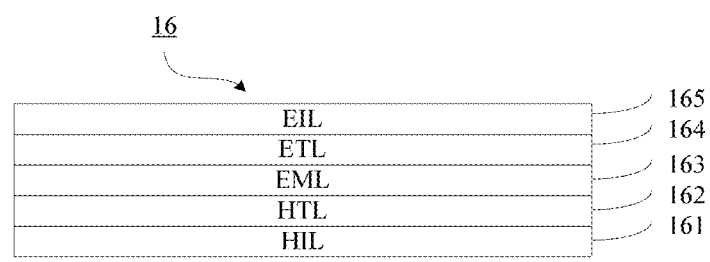
FIG. 5 is a schematic structural view of an organic electroluminescent unit in an organic electroluminescent display panel according to an embodiment of the present disclosure.

In some embodiments, each of the organic electroluminescent units 16 may sequentially include a hole injection layer (HIL) 161, a hole transport layer (HTL) 162, a light emitting layer (EML) 163, an electron transport layer (ETL) 164, and an electron injection layer (EIL) 165 in a direction from the side of anode layer 12 to the side of cathode layer 15, as shown in FIG. 5. It should be understood that the present disclosure is not limited thereto. In other implementations, these functional layers may be arranged in a different order, or some layer(s) out of them may be omitted, or additional layer(s) may be added.

For example, in some embodiments, the organic electroluminescent unit 16 may include a hole transport layer, a light emitting layer, and an electron transport layer. The organic electroluminescent unit 16 may be of any structure in the prior art, and in the embodiment of the present disclosure there is no special limitation to the structure of the organic electroluminescent unit.

Methods of manufacturing an organic electroluminescent display panel according to embodiments of the present disclosure will be described below.

Figure 6:
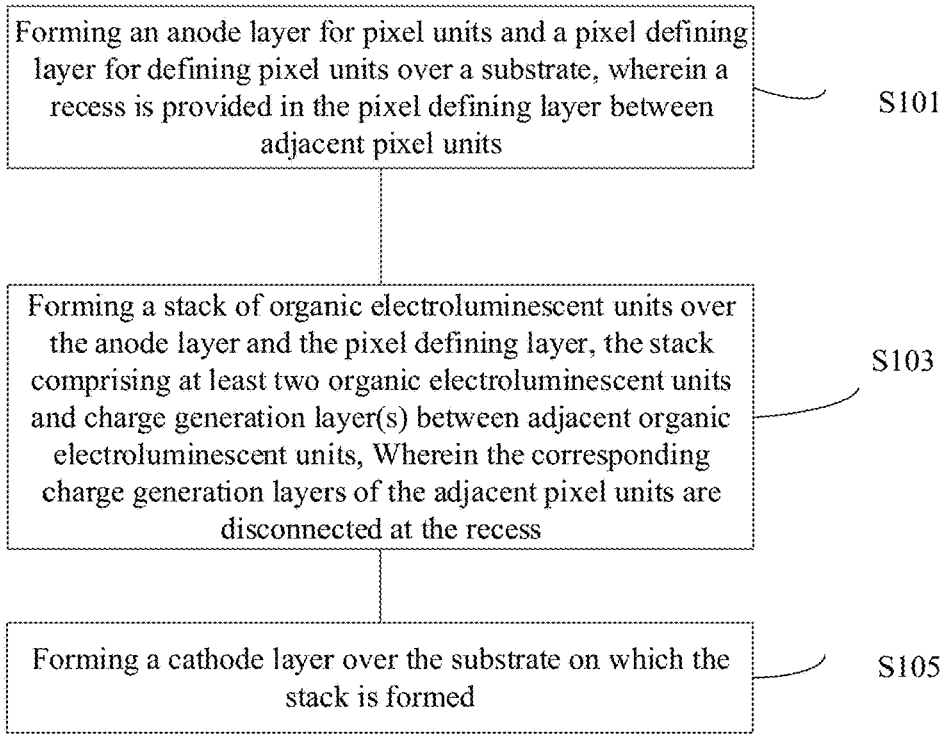
FIG. 6 illustrates a method of manufacturing an organic electroluminescent display panel in accordance with some embodiments of the present disclosure.
Figure 7A:
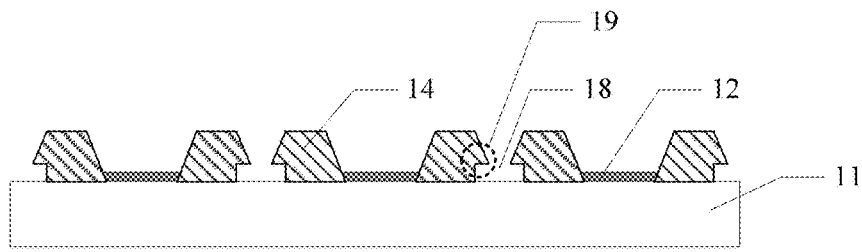
FIGS. 7(a)-7(c) are schematic views showing a structure formed by steps of a method of manufacturing an organic electroluminescent display panel according to some embodiments of the present disclosure.
Figure 7B:
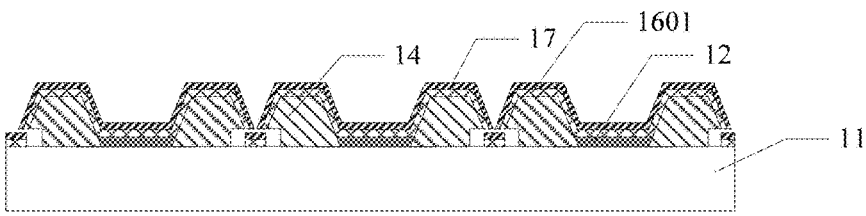
Figure 7C:
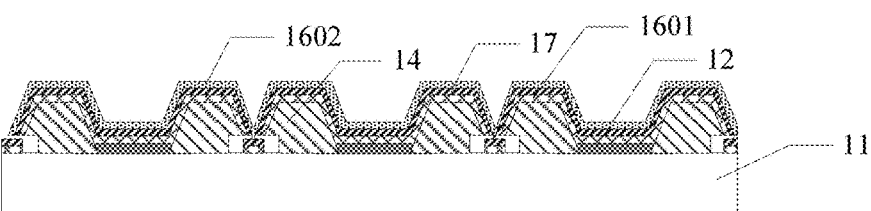

FIG. 6 illustrates a method of manufacturing an organic electroluminescent display panel in accordance with some embodiments of the present disclosure. FIGS. 7(a)-7(c) are schematic views showing structures formed by main steps of a method of manufacturing an organic electroluminescent display panel according to some embodiments of the present disclosure.

According to some embodiments of the present disclosure, a method of manufacturing an organic electroluminescent display panel may include the following steps.

In step S101, an anode layer for pixel units and a pixel defining layer for defining pixel units are formed over a substrate, wherein a recess is provided in the pixel defining layer between adjacent pixel units, as shown in FIG. 7 (a).

In step S103, a stack of organic electroluminescent units is formed over the anode layer and the pixel defining layer, the stack comprising at least two organic electroluminescent units and charge generation layer(s) between adjacent organic electroluminescent units, as shown in FIG. 7(b). Here, the corresponding charge generation layers of the adjacent pixel units are disconnected at the recess.

In step S105, a cathode layer is formed over the substrate on which the stack is formed, as shown in FIG. 7(c). Here, the cathode layer is continuous at the recess.

Figure 8:
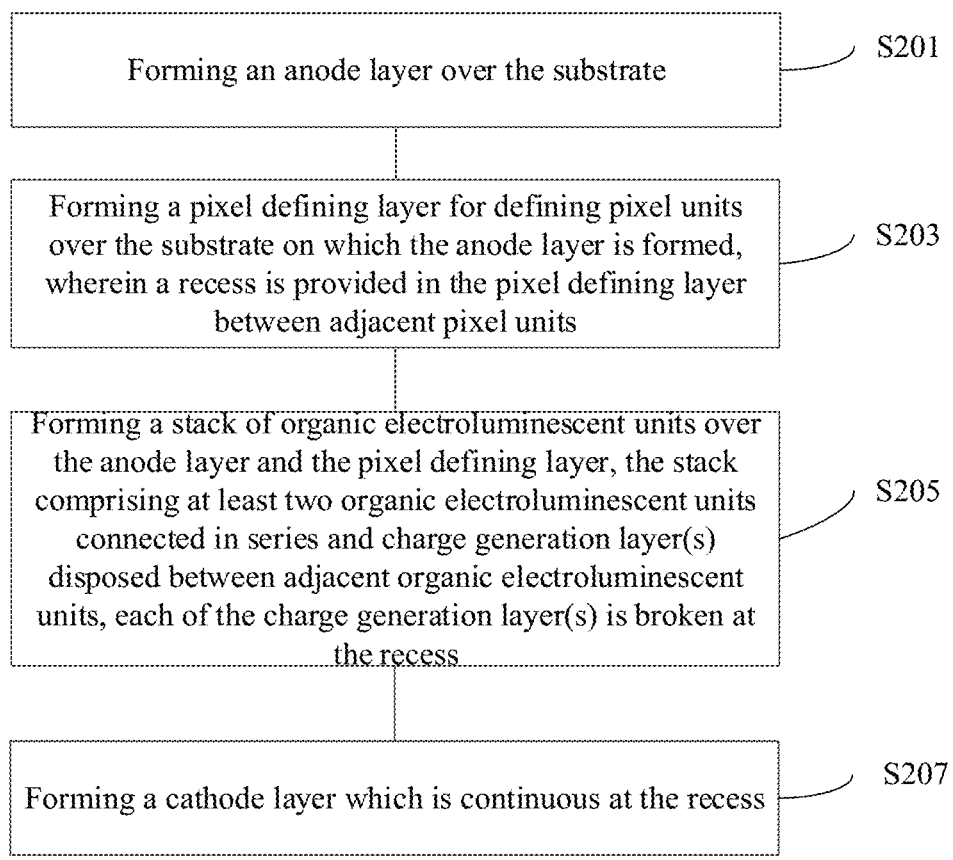
FIG. 8 is a schematic flow chart of a method for manufacturing an organic electroluminescent display panel according to an embodiment of the present disclosure.

FIG. 8 is a flow chart showing a method of manufacturing an organic electroluminescent display panel according to a further specific embodiment of the present disclosure. Referring to FIG. 8, according to an embodiment of the present disclosure, a method for manufacturing an organic electroluminescent display panel is provided which includes the following steps.

In step S201, an anode layer is formed over the substrate.

In step S203, a pixel defining layer defining pixel units is formed over the substrate on which the anode layer is formed. A recess is provided in the pixel defining layer between adjacent pixel units.

In step S205, a stack of organic electroluminescent units is formed over the anode layer and the pixel defining layer. The stack comprises at least two organic electroluminescent units connected in series. A charge generation layer is disposed between adjacent organic electroluminescent units. Each of the charge generation layer is broken at the recess.

In step S207, a cathode layer is formed. Here, a cathode layer is formed over the substrate on which the stack is formed. That is, the cathode layer covers the stack of pixel units and the cathode layer is continuous at the recess. As shown in the figure, the cathode layer is located on the organic electroluminescent unit which is farthest from the substrate.

It should be understood that the manufacturing method shown in FIG. 8 is merely exemplary and not intended to be limiting. For example, in other embodiments, the anode layer and the pixel defining layer having the recess therein may be formed over the substrate in different processes or in a different process sequence.

In some embodiments, there are N organic electroluminescent units in each pixel unit, and N is an integer ≥2. That is, the stack in the pixel unit includes N organic electroluminescent units and N−1 charge generation layers. In this case, in some more specific embodiments, the step of forming an anode layer and a pixel defining layer for defining pixel units over the substrate may include:

forming an anode layer for the pixel units over the substrate;

forming a position-occupying layer over the substrate at a position corresponding to a recess to be formed, wherein a height of the position-occupying layer is set to be larger than the sum of the thickness of (N−1 organic electroluminescent units of the N organic electroluminescent units to be formed over the anode layer and the thickness of all of the charge generation layers, and less than the sum of the thickness of the N organic electroluminescent units, the thickness of all of the charge generation layers, and the thickness of the cathode layer;

forming a pixel defining layer for defining pixel unit over the substrate on which the position-occupying layer is formed, the pixel defining layer including an opening on the position-occupying layer, the opening partially exposing the position-occupying layer;

removing the position-occupying layer to form the recess in the pixel defining layer, the recess including two opposite sidewalls, wherein at least one sidewall has a protrusion that protrudes toward the other sidewall.

In some embodiments, forming the position-occupying layer may specifically include: forming a position-occupying layer with $SiO_2$ material. Removing the position-occupying layer may include: performing dry etching on the position-occupying layer with $CF_4$ to remove the position-occupying layer.

In other embodiments, forming the position-occupying layer may also include: forming a position-occupying layer with a metal material. The method may further include: crystallizing the anode layer before removing the position-occupying layer. Removing the position-occupying layer may include: performing a wet etching on the position-occupying layer with a metal etching solution to remove the position-occupying layer.

In other embodiments, forming the position-occupying layer may also include: forming a position-occupying layer with a positive photoresist material. Forming the pixel defining layer may specifically include: forming a pixel defining layer with a negative photoresist material. Removing the position-occupying layer may also include: exposing the position-occupying layer formed by the positive photoresist material when exposing the pixel defining layer formed by the negative photoresist material; and stripping the exposed position-occupying layer with a positive photoresist stripping solution.

In some embodiments, forming the organic electroluminescent unit may specifically include:

sequentially forming a hole injection layer, a hole transport layer, a light-emitting layer, an electron transport layer, and an electron injection layer in the direction from the anode layer side to the cathode layer side.

In some embodiments, forming the organic electroluminescent unit may specifically include: forming the organic electroluminescent unit by evaporation using an open mask.

In some embodiments, forming the charge generation layer may specifically include: forming a charge generation layer by evaporation using an open mask.

In some embodiments, forming the cathode layer may specifically include: forming a cathode layer by evaporation using an open mask.

It should be understood that the manufacturing method or steps of the above embodiments are merely exemplary, and the present disclosure shall not be limited thereto.

In some embodiments, the recess is formed to penetrate the pixel defining layer in a thickness direction of the pixel defining layer. In some embodiments, the distance between a projection of an end of the second portion of the sidewall, which is adjacent the other sidewall, onto the substrate to a projection, on the substrate, of a line where the bottom of the corresponding recess intersects the first portion thereof is 0.1-5 μm.

Below, an example of manufacturing an organic electroluminescent display panel according to an embodiment of the present disclosure will be specifically described with reference to FIGS. 9(a) to 9(h) and with an example of organic electroluminescent display panel in which there are two organic electroluminescent units and a recess penetrates through the pixel defining layer in the thickness direction thereof.

Figure 9A:
FIGS. 9(a)-9(h) are schematic views showing structures formed in a process flow for manufacturing an organic electroluminescent display panel according to an embodiment of the present disclosure.

Referring to FIG. 9(a), an anode layer 12 is formed over the substrate 11. The material of the anode layer 12 can be metal, ITO or a combination thereof.

Figure 9B:
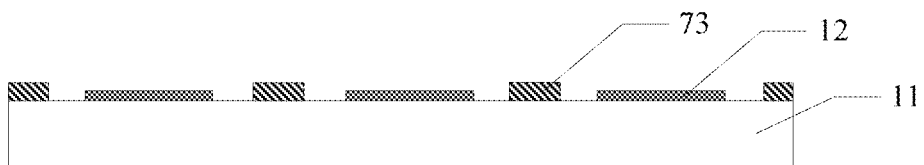

Referring to FIG. 9(b), a position-occupying layer 73 surrounding each pixel unit is formed using $SiO_2$ material over the substrate 11 on which the anode layer 12 is formed. For example, a $SiO_2$ layer may be deposited over the substrate 11 on which the anode layer 12 is formed, by plasma enhanced chemical vapor deposition (PECVD), and then the $SiO_2$ layer may be etched to form the position-occupying layer. For example, the $SiO_2$ layer can be patterned by, for example, exposure, development, dry etching, and photoresist stripping processes, thereby obtaining the position-occupying layer 73 surrounding each pixel unit. In other embodiments, the position-occupying layer may be formed of a metal material or an organic material such as a photoresist.

Figure 9C:
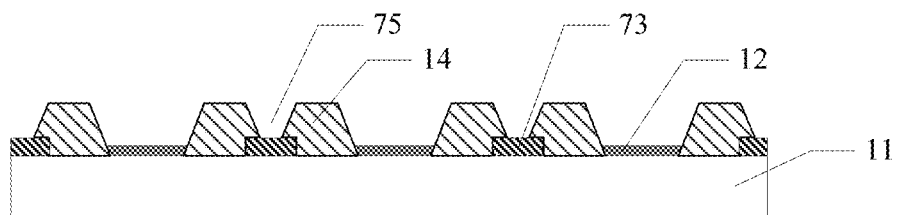

Referring to FIG. 9(c), a pixel defining layer 14 for defining pixel units is formed over the substrate 11 on which the position-occupying layer 73 is formed. The pixel defining layer 14 includes an opening 75. The opening 75 is located on the position-occupying layer 73 and exposes a part of the position-occupying layer 73.

Figure 9D:
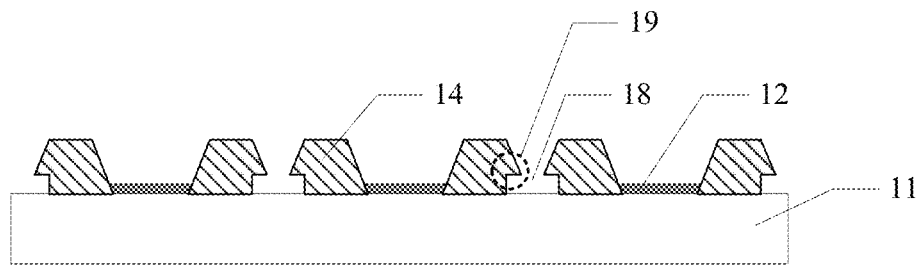

Referring to FIG. 9(d), the position-occupying layer 73 is removed. For example, for the position-occupying layer formed of $SiO_2$, the position-occupying layer 73 may be dry etched using $CF_4$ (carbon tetrafluoride) to remove the position-occupying layer 73. Thereby, a recess 18 is formed in the pixel defining layer 14. As described above, when the position-occupying layer is formed of a metal material, the anode layer (which may be formed of, for example, ITO) may be crystallized, and then the metal position-occupying layer can be removed by a metal removing liquid. The anode layer can withstand the metal removing liquid and is thus retained. Further, as described above, in the case where the position-occupying layer is formed using the photoresist, a suitable solution (for example, a suitable developer) may be used to remove the photoresist position-occupying layer.

In some embodiments, the recess 18 can be configured to surround each of the pixel units. In some embodiments, the recess 18 can include two opposite sidewalls, each having a projection 19 that projects toward the opposite sidewall, as shown with the dashed box in FIG. 9(d).

Figure 9E:
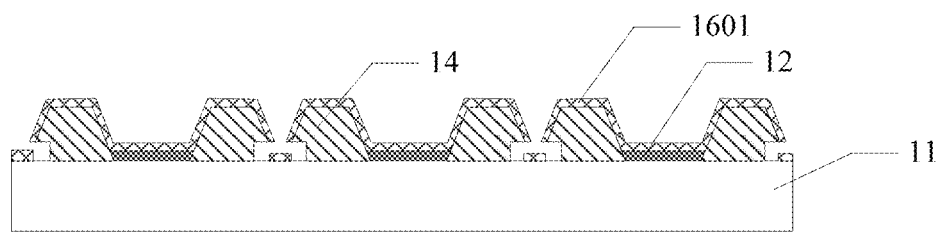

Referring to FIG. 9(e), a first organic electroluminescent unit 1601 is formed over the substrate 11 on which the pixel defining layer 14 is formed. For example, the first organic electroluminescent unit 1601 may be formed, by an evaporation process with use of an open mask, over the substrate 11 on which the pixel defining layer 14 is formed.

Figure 9F:
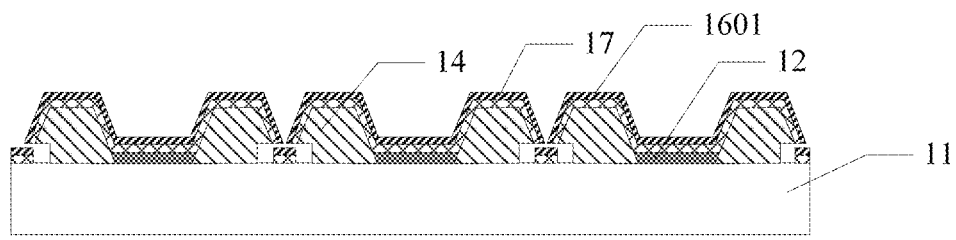

Referring to FIG. 9(f), a charge generation layer 17 is formed over the first organic electroluminescent unit 1601. For example, the charge generation layer 17 may be formed, by an evaporation process with use of an open mask, over the first organic electroluminescent unit.

Figure 9G:
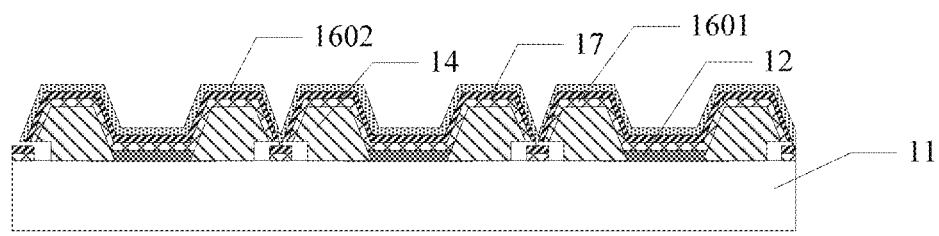

Referring to FIG. 9(g), a second organic electroluminescent unit 1602 is formed over the charge generation layer 17. For example, the second organic electroluminescent unit 1602 is formed over the charge generation layer 17 by an evaporation process with use of an open mask.

Figure 9H:
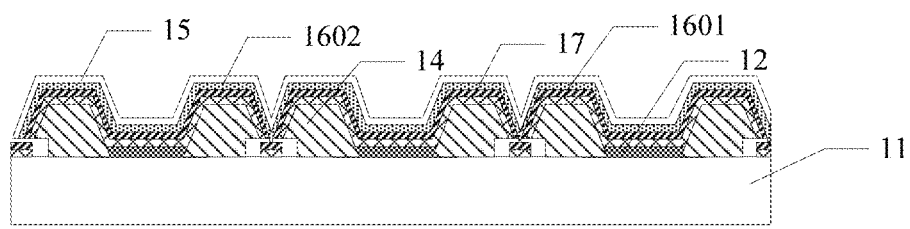

Referring to FIG. 9(h), a cathode layer 15 is formed over the substrate on which the second organic electroluminescent unit 1602 is formed (that is, a stack of organic electroluminescence units is formed). For example, the cathode layer 15 is formed over the substrate by an evaporation process with use of an open mask.

In some embodiments, the height of the position-occupying layer 73 (and therefore, the height of the corresponding recess formed, or the height of the lower edge of the protrusion of the sidewall of the recess to the bottom of the recess) is set to be larger than the sum of the thickness of one organic electroluminescent unit 1601 and the thickness of the charge generation layer 17, and is smaller than the sum of the thickness of the first organic electroluminescent unit 1601, the thickness of the charge generation layer 17, the thickness of the second organic electroluminescent unit 1602, and the thicknesses of the cathode layers 15. Thus, the charge generation layer 17 can be broken at the recess 18 and the cathode layer 15 can be continuous at the recess 18.

In some embodiments, each of the first organic electroluminescent unit 1601 and the second organic electroluminescent unit 1602 may include a hole injection layer, a hole transport layer, a light emitting layer, an electron transport layer, and an electron injection layer.

The present disclosure also contemplates a display device comprising an organic electroluminescent display panel according to any of the embodiments of the present disclosure. The display device may comprise, but is not limited to, a mobile phone, a tablet computer, a television set, a display, a notebook computer, a digital photo frame, a navigator, or any product or component having a display function.

According to the organic electroluminescent display panels, the methods of manufacturing the same, and the display devices of the embodiments of the present disclosure, it is possible to prevent lateral conduction of charges to adjacent pixel units, thereby avoiding occurrence of pixel crosstalk problems due to lateral conduction of the charge generation layer.

Those skilled in the art will appreciate that the boundaries between the operations (or steps) described in the above embodiments are merely illustrative. Multiple operations may be combined into a single operation, a single operation may be distributed among additional operations, and operations may be performed at least partially overlapping in time. Moreover, alternative embodiments may include multiple instances of a particular operation, and the operational sequence may be varied in other various embodiments. However, other modifications, changes, and replacements are also possible. Accordingly, the specification and drawings are to be regarded as illustrative, rather than limiting.

While the specific embodiments of the present disclosure have been described in detail by way of example, those skilled in the art will readily understand that these embodiments are merely for purpose for describing, not for limiting the scope of the inventions. Also, the various embodiments disclosed herein can be freely combined as appropriate without departing from the spirit and scope of the present disclosure. It will be understood by those skilled in the art that various modifications may be made to the embodiments without departing from the scope and spirit of the present disclosure. The scopes of the inventions are defined by the appended claims.

What is claimed is:

1. A method of manufacturing an organic electroluminescent display panel, comprising:
    forming over a substrate an anode layer for pixel units and a pixel defining layer for defining the pixel units, wherein a recess is provided in the pixel defining layer between adjacent pixel units, the recess having two opposite sidewalls each of which has a first portion and a second portion protruding from the first portion towards the other sidewall;
    forming a stack of organic electroluminescent units over the anode layer and the pixel defining layer, the stack comprising at least two organic electroluminescent units and a charge generation layer between adjacent organic electroluminescent units, wherein corresponding discharge generation layers of adjacent pixel units are disconnected at the recess; and
    forming a cathode layer over the substrate over which the stack is formed, wherein the cathode layer is continuous at the recess.

2. The method according to claim 1, wherein in each of the pixel units, the stack comprises N organic electroluminescent units, and N is an integer ≥2, and
    wherein forming over the substrate the anode layer for the pixel units and the pixel defining layer for defining the pixel units comprises:
        forming the anode layer for the pixel units over the substrate;
        forming a position-occupying layer at a position on the substrate corresponding to the recess to be formed, wherein a height of the position-occupying layer is set to be larger than a sum of the thicknesses of (N−1) organic electroluminescent units and all of the charge generation layers to be formed over the anode layer, and less than a sum of the thickness of the N organic electroluminescent units to be formed, the thickness of all of the charge generation layers, and the thickness of the cathode layer;
        forming a pixel defining layer for defining pixel units, the pixel defining layer including an opening on the position-occupying layer, the opening exposing a part of the position-occupying layer; and
        removing the position-occupying layer to form the recess in the pixel defining layer.

3. The method according to claim 2, wherein
    forming the position-occupying layer comprises forming the position-occupying layer with $SiO_2$ material;
    removing the position-occupying layer comprises dry etching the position-occupying layer with $CF_4$ to remove the position-occupying layer.

4. The method according to claim 2, wherein
    forming the position-occupying layer comprises forming the position-occupying layer with a metal material;
    removing the position-occupying layer comprises: wet etching the position-occupying layer with a metal etching solution to remove the position-occupying layer; and
    the method further comprising: before removing the position-occupying layer, crystallizing the anode layer.

5. The method according to claim 2, wherein
    forming the position-occupying layer comprises forming the position-occupying layer with a positive photoresist material;
    forming the pixel defining layer comprises forming the pixel defining layer with a negative photoresist material; and
    removing the position-occupying layer comprises:
        exposing the position-occupying layer formed with the positive photoresist material while exposing the pixel defining layer formed with the negative photoresist material; and
        stripping the exposed position-occupying layer off using a positive photoresist stripping solution.

6. The method according to claim 1, wherein the organic electroluminescence unit comprises:
    a hole injection layer, a hole transport layer, a light-emitting layer, an electron transport layer, and an electron injection layer which are sequentially formed in a direction from the anode layer side to the cathode layer side.

7. The method according to claim 1, wherein the organic electroluminescence unit is formed by evaporation using an open mask.

8. The method according to claim 1, wherein the charge generation layer is formed by evaporation using an open mask.

9. The method according to claim 1, wherein the cathode layer is formed by evaporation using an open mask.

10. The method according to claim 1, wherein the recess penetrates the pixel defining layer in a thickness direction of the pixel defining layer.

11. The method according to claim 2, wherein a distance between a projection, on the substrate, of an end of the second portion which is adjacent to the other sidewall and a projection, on the substrate, of an intersection line of the first portion with the bottom of the corresponding recess is 0.1-5 µm.

* * * * *